US012610743B2

(12) United States Patent
Huang et al.

(10) Patent No.: US 12,610,743 B2
(45) Date of Patent: Apr. 21, 2026

(54) PIEZOELECTRIC MATERIAL COMPOSITE MEMBRANE ACOUSTIC COMPONENT WITH BROADBAND AND HIGH SOUND QUALITY AND MANUFACTURING METHOD THEREOF

(71) Applicant: National Taiwan University, Taipei (TW)

(72) Inventors: Yu-Hsi Huang, Taipei (TW); Yu-Chen Huang, Taipei (TW)

(73) Assignee: NATIONAL TAIWAN UNIVERSITY, Taipei (TW)

( * ) Notice: Subject to any disclaimer, the term of this patent is extended or adjusted under 35 U.S.C. 154(b) by 659 days.

(21) Appl. No.: 17/981,078

(22) Filed: Nov. 4, 2022

(65) Prior Publication Data

US 2024/0107889 A1 Mar. 28, 2024

(30) Foreign Application Priority Data

Sep. 22, 2022 (TW) .................................. 111135939

(51) Int. Cl.
*H10N 30/20* (2023.01)
*H10N 30/092* (2023.01)
*H10N 30/50* (2023.01)
*H10N 30/85* (2023.01)
*H10N 30/87* (2023.01)
*H10N 30/88* (2023.01)

(52) U.S. Cl.
CPC ....... *H10N 30/2047* (2023.02); *H10N 30/092* (2023.02); *H10N 30/50* (2023.02);
(Continued)

(58) Field of Classification Search
CPC .... H10N 30/2047; H10N 30/50; H10N 30/87; H10N 30/88; H10N 30/503
See application file for complete search history.

(56) References Cited

U.S. PATENT DOCUMENTS

2003/0034714 A1* 2/2003 Takeshima ............. H04R 17/00
310/324
2010/0072860 A1* 3/2010 Kim ..................... H10N 30/074
29/25.35
(Continued)

FOREIGN PATENT DOCUMENTS

CN 1946248 A * 4/2007
CN 102460938 A * 5/2012 ............... H04R 7/06
(Continued)

OTHER PUBLICATIONS

Translation of CN-102460938-A (Year: 2012).*
(Continued)

*Primary Examiner* — Jeffrey T Carley
(74) *Attorney, Agent, or Firm* — MUNCY, GEISSLER, OLDS & LOWE, P.C.

(57) ABSTRACT

A piezoelectric material composite membrane acoustic component with broadband and high sound quality includes a vibrating membrane which is an electrically conductive membrane, a supporting frame having a hollow portion penetrating the supporting frame, a piezoelectric plat set including a first-piezoelectric-plate and a second-piezoelectric-plate formed on and electrically connected to the first-piezoelectric-plate and an AC power source. A fixing portion of the vibrating membrane is fixed by the supporting frame. Each of the first-piezoelectric-plate and the second-piezoelectric-plate includes a top-electrode-layer, a piezoelectric-layer and a bottom-electrode-layer. The bottom-electrode-layer of the first-piezoelectric-plate is fixed on and electrically connected to a piezoelectric-plate fixing portion of the vibrating membrane. A spacing portion of the vibrating membrane is between the fixing portion and the piezoelectric-plate fixing portion. The AC power source includes a first electrode and a second electrode electrically con- (Continued)

nected to the top-electrode-layer of the first-piezoelectric-plate and the vibrating membrane, respectively.

12 Claims, 6 Drawing Sheets

(52) U.S. Cl.
CPC ........... *H10N 30/852* (2023.02); *H10N 30/87* (2023.02); *H10N 30/88* (2023.02)

(56) References Cited

U.S. PATENT DOCUMENTS

| | | | | |
|---|---|---|---|---|
| 2015/0171311 A1* | 6/2015 | Kubota | .................. | H10N 30/50 |
| | | | | 347/68 |
| 2017/0006381 A1* | 1/2017 | Rusconi Clerici | ..... | H04R 17/00 |

FOREIGN PATENT DOCUMENTS

| | | | | | | |
|---|---|---|---|---|---|---|
| JP | 2011129369 A | * | 6/2011 | ............. | H01H 57/00 |
| JP | 2023520884 A | * | 5/2023 | ............. | H10N 30/40 |
| WO | WO-2009128245 A1 | * | 10/2009 | ............. | F04B 43/046 |
| WO | WO-2021187086 A1 | * | 9/2021 | ............. | H04R 17/00 |

OTHER PUBLICATIONS

Translation of JP-2011129369-A (Year: 2011).*
Translation of JP-2023520884-A (Year: 2023).*
Translation of WO-2021187086-A1 (Year: 2021).*
Translation of CN-1946248-A (Year: 2007).*
Translation of WO-2009128245-A1 (Year: 2009).*

* cited by examiner

PIEZOELECTRIC MATERIAL COMPOSITE MEMBRANE ACOUSTIC COMPONENT WITH BROADBAND AND HIGH SOUND QUALITY AND MANUFACTURING METHOD THEREOF

FIELD OF THE INVENTION

The present invention is related to a piezoelectric material composite membrane acoustic component with broadband and high sound quality and manufacturing method thereof, especially a piezoelectric material composite membrane acoustic component having two stacked piezoelectric plates with broadband and high sound quality and manufacturing method thereof.

BACKGROUND OF THE INVENTION

The miniaturization of speakers is the development trend of today's technology. Manufacturers are also continuing to develop lightweight, ultra-miniaturized and/or ultra-thin speakers to provide audio and video equipment such as TVs for home use, or computers, tablets, mobile phones and headphones. The conventional moving-coil speaker has its limit in the trend of light weight, miniaturization and thinning because it needs a permanent magnet as a driving element. The conventional flat film electrostatic speaker requires additional complicated circuit design and a battery, which is costly and difficult to carry. The conventional thin-film speaker with a single piezoelectric plate has the advantages of miniaturization and thinning, however its frequency bandwidth is narrow, and the sound response curve is not smooth, so it cannot achieve a larger frequency response and cannot reach balanced sound quality at low frequencies, intermediate frequencies and high frequencies. Accordingly, the present invention has developed a new design which may avoid the above-described drawbacks, may significantly enhance the performance of the devices and may take into account economic considerations. Therefore, the present invention then has been invented.

SUMMARY OF THE INVENTION

The main technical problem that the present invention is seeking to solve is how to provide a lightweight and thin acoustic component with a smoother response curve, a larger frequency response, and can achieve balanced sound quality at low frequencies, intermediate frequencies and high frequencies.

In order to solve the above described problems and to achieve the expected effect, the present invention provides a piezoelectric material composite membrane acoustic component with broadband and high sound quality, which comprises a vibrating membrane, a supporting frame, a piezoelectric plate set and an AC power source. The vibrating membrane is an electrically conductive membrane. The supporting frame has a hollow portion. The supporting frame is vertically penetrated by the hollow portion. A membrane fixing portion of the vibrating membrane is fixed by the supporting frame such that a piezoelectric plate fixing portion and at least one spacing portion of the vibrating membrane are corresponding to the hollow portion of the supporting frame. At least one of the at least one spacing portion is between the membrane fixing portion and the piezoelectric plate fixing portion. The piezoelectric plate set includes a first piezoelectric plate and a second piezoelectric plate. The first piezoelectric plate includes a first top electrode layer, a first piezoelectric layer and a first bottom electrode layer. The second piezoelectric plate includes a second top electrode layer, a second piezoelectric layer and a second bottom electrode layer. The first bottom electrode layer of the first piezoelectric plate is fixed on the piezoelectric plate fixing portion of the vibrating membrane and electrically connected to the piezoelectric plate fixing portion of the vibrating membrane. The second bottom electrode layer of the second piezoelectric plate is fixed on the first top electrode layer of the first piezoelectric plate and electrically connected to the first top electrode layer of the first piezoelectric plate. The AC power source includes a first electrode electrically connected to the second top electrode layer of the second piezoelectric plate and a second electrode electrically connected to the vibrating membrane.

Moreover, the present invention further provides a piezoelectric material composite membrane acoustic component with broadband and high sound quality, which comprises a vibrating membrane, a supporting frame, a piezoelectric plate set and an AC power source. The supporting frame has a hollow portion. The supporting frame is vertically penetrated by the hollow portion. A membrane fixing portion of the vibrating membrane is fixed by the supporting frame such that a piezoelectric plate fixing portion and at least one spacing portion of the vibrating membrane are corresponding to the hollow portion of the supporting frame. At least one of the at least one spacing portion is between the membrane fixing portion and the piezoelectric plate fixing portion. The piezoelectric plate fixing portion of the vibrating membrane has a through hole penetrating the piezoelectric plate fixing portion of the vibrating membrane. The piezoelectric plate set includes a first piezoelectric plate and a second piezoelectric plate. The first piezoelectric plate includes a first top electrode layer, a first piezoelectric layer and a first bottom electrode layer. The second piezoelectric plate includes a second top electrode layer, a second piezoelectric layer and a second bottom electrode layer. The first bottom electrode layer of the first piezoelectric plate is fixed on the piezoelectric plate fixing portion of the vibrating membrane. The second bottom electrode layer of the second piezoelectric plate is fixed on the first top electrode layer of the first piezoelectric plate and electrically connected to the first top electrode layer of the first piezoelectric plate. The AC power source includes a first electrode electrically connected to the second top electrode layer of the second piezoelectric plate and a second electrode electrically connected to the first bottom electrode layer of the first piezoelectric plate through the through hole.

In implementation, the first piezoelectric layer has a first polarization direction perpendicular to the first piezoelectric layer, the second piezoelectric layer has a second polarization direction perpendicular to the second piezoelectric layer, the first polarization direction and the second polarization direction are one of the same direction and the opposite direction. The first piezoelectric plate and the second piezoelectric plate have the same shape and the same thickness. The first piezoelectric layer and the second piezoelectric layer are made of a piezoelectric ceramic respectively, wherein the piezoelectric ceramic is at least one selected from the group consisting of lead zirconate titanate PZT-5A, lead zirconate titanate PZT-5H and lead zirconate titanate PZT-5J. In a preferred embodiment, the piezoelectric ceramic is made of lead zirconate titanate PSI-5A4E. The shapes of the first piezoelectric plate and the second piezoelectric plate are one selected from the group consisting of a quadrilateral, a polygon, an oval, a circle and a ring.

In implementation, the hollow portion of the supporting frame is defined by an inner edge of the supporting frame, a shape of the inner edge of the supporting frame is one selected from the group consisting of a quadrilateral, a polygon, an oval and a circle.

Moreover, the present invention further provides a manufacturing method of piezoelectric material composite membrane acoustic component with broadband and high sound quality, which comprises following steps of: fixing a periphery region of a vibrating membrane by a fixing device such that a middle region of the vibrating membrane is corresponding to a device hollow portion of the fixing device, wherein the fixing device is vertically penetrated by the device hollow portion, the vibrating membrane is an electrically conductive membrane; placing a tension-applying device in the device hollow portion of the fixing device under the vibrating membrane, wherein a height of the tension-applying device is greater than a height of the device hollow portion of the fixing device under the vibrating membrane, such that a top portion of the tension-applying device is against the vibrating membrane so as to increase a tension of the vibrating membrane; fixing a piezoelectric plate set including a first piezoelectric plate and a second piezoelectric plate on a piezoelectric plate fixing portion of the vibrating membrane, and fixing a membrane fixing portion of the vibrating membrane by a supporting frame, such that the piezoelectric plate fixing portion and at least one spacing portion between the membrane fixing portion and the piezoelectric plate fixing portion of the vibrating membrane are corresponding to a hollow portion of the supporting frame, the first piezoelectric plate includes a first top electrode layer, a first piezoelectric layer and the first bottom electrode layer, the second piezoelectric plate includes a second top electrode layer, a second piezoelectric layer and a second bottom electrode layer, first bottom electrode layer of the first piezoelectric plate is fixed on the piezoelectric plate fixing portion of the vibrating membrane and electrically connected to the piezoelectric plate fixing portion of the vibrating membrane, the second bottom electrode layer of the second piezoelectric plate is fixed on the first top electrode layer of the first piezoelectric plate and electrically connected to the first top electrode layer of the first piezoelectric plate; and electrically connecting a first electrode and a second electrode of an AC power source to the second top electrode layer of the second piezoelectric plate and the vibrating membrane.

In implementation, the first bottom electrode layer of the first piezoelectric plate is electrically connected to the piezoelectric plate fixing portion of the vibrating membrane through an electrically conductive adhesive.

Moreover, the present invention further provides a manufacturing method of piezoelectric material composite membrane acoustic component with broadband and high sound quality, which comprises following steps of: fixing a periphery region of a vibrating membrane by a fixing device such that a middle region of the vibrating membrane is corresponding to a device hollow portion of the fixing device, wherein the fixing device is vertically penetrated by the device hollow portion; placing a tension-applying device in the device hollow portion of the fixing device under the vibrating membrane, wherein a height of the tension-applying device is greater than a height of the device hollow portion of the fixing device under the vibrating membrane, such that a top portion of the tension-applying device is against the vibrating membrane so as to increase a tension of the vibrating membrane; fixing a piezoelectric plate set including a first piezoelectric plate and a second piezoelectric plate on a piezoelectric plate fixing portion of the vibrating membrane, and fixing a membrane fixing portion of the vibrating membrane by a supporting frame, such that the piezoelectric plate fixing portion and at least one spacing portion between the membrane fixing portion and the piezoelectric plate fixing portion of the vibrating membrane are corresponding to a hollow portion of the supporting frame, the piezoelectric plate fixing portion of the vibrating membrane has a through hole penetrating the piezoelectric plate fixing portion of the vibrating membrane, the first piezoelectric plate includes a first top electrode layer, a first piezoelectric layer and the first bottom electrode layer, the second piezoelectric plate includes a second top electrode layer, a second piezoelectric layer and a second bottom electrode layer, first bottom electrode layer of the first piezoelectric plate is fixed on the piezoelectric plate fixing portion of the vibrating membrane and electrically connected to the piezoelectric plate fixing portion of the vibrating membrane, the second bottom electrode layer of the second piezoelectric plate is fixed on the first top electrode layer of the first piezoelectric plate and electrically connected to the first top electrode layer of the first piezoelectric plate; and electrically connecting a first electrode of an AC power source to the second top electrode layer of the second piezoelectric plate and a second electrode of the AC power source to the first bottom electrode layer of the first piezoelectric plate through the through hole, respectively.

In implementation, the manufacturing method further comprises a step of applying an external force on the piezoelectric plate set such that the first bottom electrode layer of the first piezoelectric plate of the piezoelectric plate set is tightly fixed with the piezoelectric plate fixing portion of the vibrating membrane.

In implementation, the supporting frame includes a top supporting frame and a bottom supporting frame, the top supporting frame has a top hollow portion, the bottom supporting frame has a bottom hollow portion, the membrane fixing portion of the vibrating membrane is sandwiched and fixed by the top supporting frame and the bottom supporting frame respectively, such that the piezoelectric plate fixing portion and the at least one spacing portion of the vibrating membrane are corresponding to the top hollow portion of the top supporting frame and the bottom hollow portion of the bottom supporting frame, respectively.

In implementation, the fixing device includes a top fixing device and a bottom fixing device, the device hollow portion includes a top device hollow portion of the top fixing device and a bottom device hollow portion of the bottom fixing device, wherein the periphery region of the vibrating membrane is sandwiched and fixed by the top fixing device and the bottom fixing device respectively, such that the middle region of the vibrating membrane is corresponding to the top device hollow portion of the top fixing device and the bottom device hollow portion of the bottom fixing device, respectively.

In implementation, the fixing device further comprises at least one silicone layer, wherein (1) the at least one silicone layer is disposed on a bottom surface of the top fixing device such that the periphery region of the vibrating membrane is fixed between the at least one silicone layer and the bottom fixing device, (2) the at least one silicone layer is disposed on a top surface of the bottom fixing device such that the periphery region of the vibrating membrane is fixed between the top fixing device and the at least one silicone layer, or (3) the periphery region of the vibrating membrane is fixed between one of the at least one silicone layer disposed on a bottom surface of the top fixing device and the other of the at least one silicone layer disposed on a top surface of the bottom fixing device.

In implementation, the fixing device further comprises at least one silicone layer, at least one of a top and a bottom of the periphery region of the vibrating membrane is fixed by the at least one silicone layer.

In implementation, the manufacturing method further comprises a step of cutting the vibrating membrane between the periphery region and the membrane fixing portion of the vibrating membrane.

For further understanding the characteristics and effects of the present invention, some preferred embodiments referred to drawings are in detail described as follows.

DETAILED DESCRIPTIONS OF PREFERRED EMBODIMENTS

Figure 1:
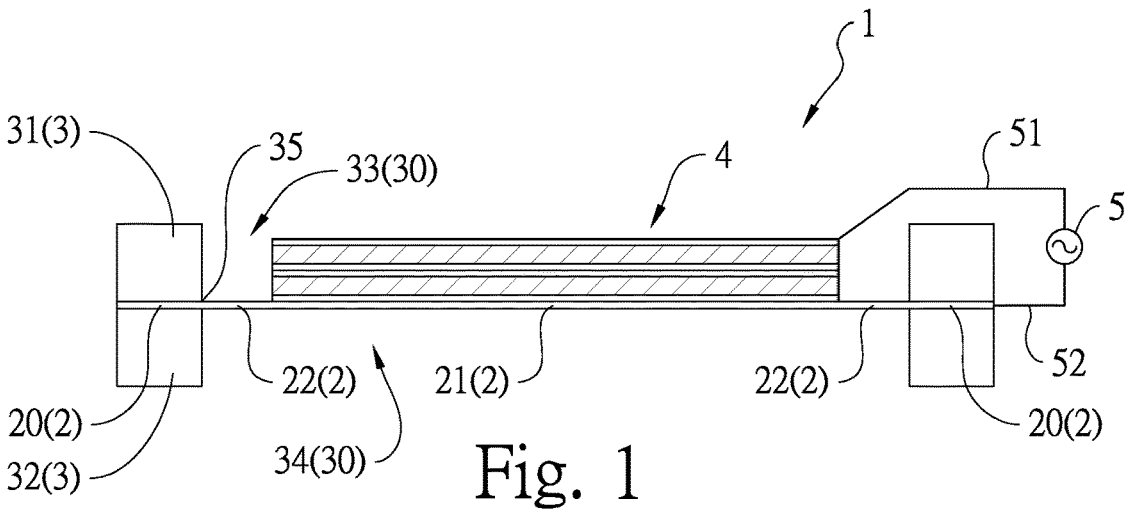
FIG. 1 is the cross-sectional schematic showing an embodiment of a piezoelectric material composite membrane acoustic component with broadband and high sound quality of the present invention.
Figure 2:
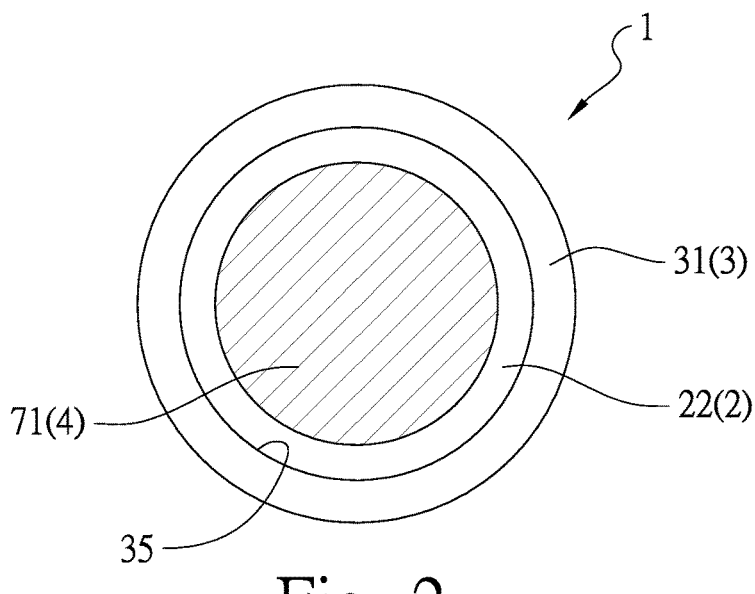
FIG. 2 is the top view schematic of the embodiment of FIG. 1.
Figure 3:
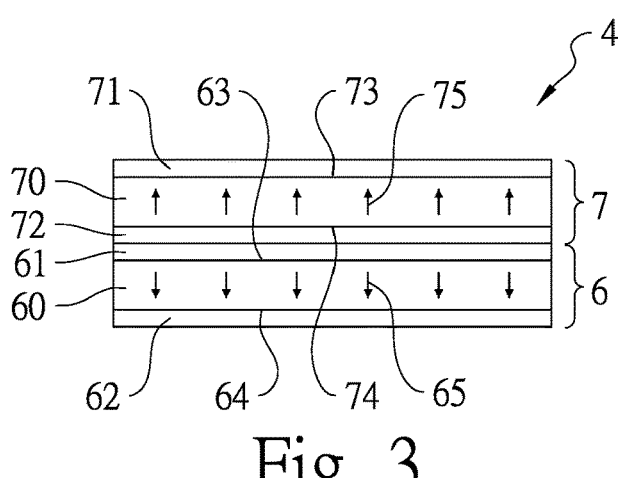
FIG. 3 is the cross-sectional schematic showing the polarization directions of two piezoelectric layers of the embodiment of FIG. 1.

Please refer to FIG. 1, which shows the cross-sectional schematic of an embodiment of a piezoelectric material composite membrane acoustic component with broadband and high sound quality of the present invention. Please also refer to FIGS. 2 and 3, which show the top view schematic and the cross-sectional schematic of the polarization directions of two piezoelectric layers of the embodiment of FIG. 1, respectively. A piezoelectric material composite membrane acoustic component 1 with broadband and high sound quality of the present invention comprises a vibrating membrane 2, a supporting frame 3, a piezoelectric plate set 4 and an AC power source 5. In current embodiment, the vibrating membrane 2 is an electrically conductive membrane. The vibrating membrane 2 includes a membrane fixing portion 20 (the shape of the fixing portion 20 is a ring), a piezoelectric plate fixing portion 21 (the shape of the piezoelectric plate fixing portion 21 is a circle) and a spacing portion 22 (the shape of the spacing portion 22 is a ring). The spacing portion 22 is between the fixing portion 20 and the piezoelectric plate fixing portion 21. The supporting frame 3 includes a top supporting frame 31 and a bottom supporting frame 32. The supporting frame 3 has a hollow portion 30. The supporting frame 3 is vertically penetrated by the hollow portion 30. The hollow portion 30 is defined by an inner edge 35 of the supporting frame 3 (in current embodiment, the shape of the inner edge 35 is a circle; i.e. the shape of the hollow portion 30 is a circle). The hollow portion 30 includes a top hollow portion 33 of the top supporting frame 31 and a bottom hollow portion 34 of the bottom supporting frame 32. The top supporting frame 31 is vertically penetrated by the top hollow portion 33. The bottom supporting frame 32 is vertically penetrated by the bottom hollow portion 34. The membrane fixing portion 20 of the vibrating membrane 2 is sandwiched and fixed by the top supporting frame 31 and the bottom supporting frame 32 of the supporting frame 3, such that the piezoelectric plate fixing portion 21 and the spacing portion 22 of the vibrating membrane 2 are corresponding to the hollow portion 30 of the supporting frame 3 (i.e., the piezoelectric plate fixing portion 21 and the spacing portion 22 of the vibrating membrane 2 are corresponding to the top hollow portion 33 of the top supporting frame 31 and the bottom hollow portion 34 of the bottom supporting frame 32, respectively). The piezoelectric plate set 4 includes a first piezoelectric plate 6 and a second piezoelectric plate 7. The first piezoelectric plate 6 includes a first piezoelectric layer 60, a first top electrode layer 61 and a first bottom electrode layer 62. The second piezoelectric plate 7 includes a second piezoelectric layer 70, a second top electrode layer 71 and a second bottom electrode layer 72. The first piezoelectric plate 6 and the second piezoelectric plate 7 have the same shape and the same thickness. The piezoelectric plate set 4 (including the first piezoelectric plate 6 and the second piezoelectric plate 7) and the piezoelectric plate fixing portion 21 have the same shape; i.e., in current embodiment, the shape of the piezoelectric plate set 4 is a circle. The first top electrode layer 61 is formed on a first top surface 63 of the first piezoelectric layer 60. The first bottom electrode layer 62 is formed on a first bottom surface 64 of the first piezoelectric layer 60. The first bottom electrode layer 62 of the first piezoelectric plate 6 is fixed on the piezoelectric plate fixing portion 21 of the vibrating membrane 2 through an electrically conductive adhesive, such that the first bottom electrode layer 62 of the first piezoelectric plate 6 is electrically connected to the piezoelectric plate fixing portion 21 of the vibrating membrane 2. The second top electrode layer 71 is formed on a second top surface 73 of the second piezoelectric layer 70. The second bottom electrode layer 72 is formed on a second bottom surface 74 of the second piezoelectric layer 70. The second bottom electrode layer 72 of the second piezoelectric plate 7 is fixed on the first top electrode layer 61 of the first piezoelectric plate

6 such that the second bottom electrode layer 72 of the second piezoelectric plate 7 is electrically connected to the first top electrode layer 61 of the first piezoelectric plate 6. The AC power source 5 includes a first electrode 51 and a second electrode 52. The first electrode 51 is electrically connected to the second top electrode layer 71 of the second piezoelectric plate 7. The second electrode 52 is electrically connected to the vibrating membrane 2. In current embodiment, the first piezoelectric layer 60 and the second piezoelectric layer 70 are made of a piezoelectric ceramic respectively, wherein the piezoelectric ceramic may be at least one selected from the group consisting of lead zirconate titanate PZT-5A, lead zirconate titanate PZT-5H and lead zirconate titanate PZT-5J. In a preferred embodiment, the piezoelectric ceramic is made of lead zirconate titanate PSI-5A4E (Lead zirconate titanate piezoelectric (PZT) ceramic, model PSI-5A4E from Piezo System Inc.). The first piezoelectric layer 60 has a first polarization direction 65 perpendicular to the first piezoelectric layer 60. The second piezoelectric layer 70 has a second polarization direction 75 perpendicular to the second piezoelectric layer 70. In current embodiment, the first polarization direction 65 is vertically downward; while the second polarization direction 75 is vertically upward (i.e., the first polarization direction 65 is opposite to the second polarization direction 75). Therefore, the piezoelectric material composite membrane acoustic component 1 with broadband and high sound quality of the present invention can indeed achieve an acoustic component with a smoother response curve, a larger frequency response, and can achieve balanced sound quality at low frequencies, intermediate frequencies and high frequencies.

In some embodiments, the vibrating membrane 2 may be an electrically conductive membrane formed by sputtering a PVC membrane.

Figure 4:
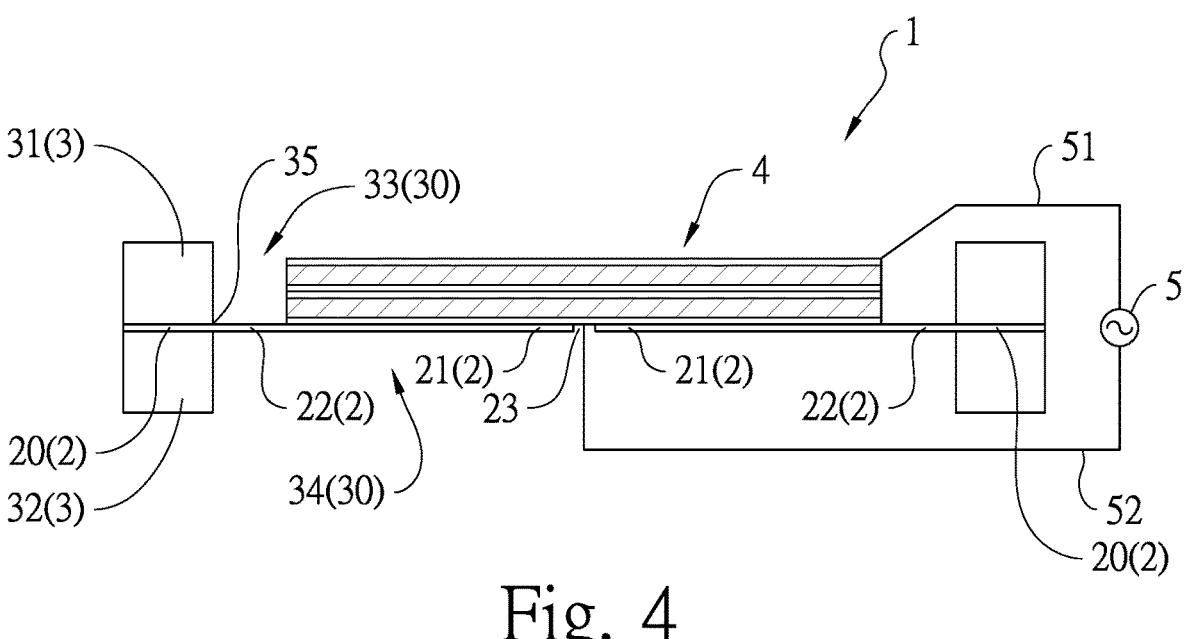
FIG. 4 is the cross-sectional schematic showing another embodiment of a piezoelectric material composite membrane acoustic component with broadband and high sound quality of the present invention.

Please refer to FIG. 4, which shows the cross-sectional schematic of another embodiment of a piezoelectric material composite membrane acoustic component with broadband and high sound quality of the present invention. A piezoelectric material composite membrane acoustic component 1 with broadband and high sound quality of the present invention comprises a vibrating membrane 2, a supporting frame 3, a piezoelectric plate set 4 and an AC power source 5. In current embodiment, the vibrating membrane 2 may be a non-electrically conductive membrane or an electrically conductive membrane. The vibrating membrane 2 includes a membrane fixing portion 20 (the shape of the fixing portion 20 is a ring), a piezoelectric plate fixing portion 21 (the shape of the piezoelectric plate fixing portion 21 is a circle) and a spacing portion 22 (the shape of the spacing portion 22 is a ring). The spacing portion 22 is between the fixing portion 20 and the piezoelectric plate fixing portion 21. The piezoelectric plate fixing portion 21 of the vibrating membrane 2 has a through hole 23. The piezoelectric plate fixing portion 21 of the vibrating membrane 2 is penetrated by the through hole 23. The supporting frame 3 includes a top supporting frame 31 and a bottom supporting frame 32. The supporting frame 3 has a hollow portion 30. The supporting frame 3 is vertically penetrated by the hollow portion 30. The hollow portion 30 is defined by an inner edge 35 of the supporting frame 3 (in current embodiment, the shape of the inner edge 35 is a circle; i.e. the shape of the hollow portion 30 is a circle). The hollow portion 30 includes a top hollow portion 33 of the top supporting frame 31 and a bottom hollow portion 34 of the bottom supporting frame 32. The top supporting frame 31 is vertically penetrated by the top hollow portion 33. The bottom supporting frame 32 is vertically penetrated by the bottom hollow portion 34. The membrane fixing portion 20 of the vibrating membrane 2 is sandwiched and fixed by the top supporting frame 31 and the bottom supporting frame 32 of the supporting frame 3, such that the piezoelectric plate fixing portion 21 and the spacing portion 22 of the vibrating membrane 2 are corresponding to the hollow portion 30 of the supporting frame 3 (i.e., the piezoelectric plate fixing portion 21 and the spacing portion 22 of the vibrating membrane 2 are corresponding to the top hollow portion 33 of the top supporting frame 31 and the bottom hollow portion 34 of the bottom supporting frame 32, respectively). The piezoelectric plate set 4 includes a first piezoelectric plate 6 and a second piezoelectric plate 7. The first piezoelectric plate 6 includes a first piezoelectric layer 60, a first top electrode layer 61 and a first bottom electrode layer 62. The second piezoelectric plate 7 includes a second piezoelectric layer 70, a second top electrode layer 71 and a second bottom electrode layer 72. The first piezoelectric plate 6 and the second piezoelectric plate 7 have the same shape and the same thickness. The piezoelectric plate set 4 (including the first piezoelectric plate 6 and the second piezoelectric plate 7) and the piezoelectric plate fixing portion 21 have the same shape; i.e., in current embodiment, the shape of the piezoelectric plate set 4 is a circle. The first top electrode layer 61 is formed on a first top surface 63 of the first piezoelectric layer 60. The first bottom electrode layer 62 is formed on a first bottom surface 64 of the first piezoelectric layer 60. The first bottom electrode layer 62 of the first piezoelectric plate 6 is fixed on the piezoelectric plate fixing portion 21 of the vibrating membrane 2 (in current embodiment, the first bottom electrode layer 62 of the first piezoelectric plate 6 may be fixed on the piezoelectric plate fixing portion 21 of the vibrating membrane 2 through a non-electrically conductive adhesive, such that the first bottom electrode layer 62 of the first piezoelectric plate 6 is non-electrically connected to the piezoelectric plate fixing portion 21 of the vibrating membrane 2; or the first bottom electrode layer 62 of the first piezoelectric plate 6 may be fixed on the piezoelectric plate fixing portion 21 of the vibrating membrane 2 through an electrically conductive adhesive, such that the first bottom electrode layer 62 of the first piezoelectric plate 6 is electrically connected to the piezoelectric plate fixing portion 21 of the vibrating membrane 2). The second top electrode layer 71 is formed on a second top surface 73 of the second piezoelectric layer 70. The second bottom electrode layer 72 is formed on a second bottom surface 74 of the second piezoelectric layer 70. The second bottom electrode layer 72 of the second piezoelectric plate 7 is fixed on the first top electrode layer 61 of the first piezoelectric plate 6 such that the second bottom electrode layer 72 of the second piezoelectric plate 7 is electrically connected to the first top electrode layer 61 of the first piezoelectric plate 6. The AC power source 5 includes a first electrode 51 and a second electrode 52. The first electrode 51 is electrically connected to the second top electrode layer 71 of the second piezoelectric plate 7. The second electrode 52 is electrically connected to the first bottom electrode layer 62 of the first piezoelectric plate 6 through the through hole 23. In current embodiment, the first piezoelectric layer 60 and the second piezoelectric layer 70 are made of a piezoelectric ceramic respectively, wherein the piezoelectric ceramic may be at least one selected from the group consisting of lead zirconate titanate PZT-5A, lead zirconate titanate PZT-5H and lead zirconate titanate PZT-5J. In a preferred embodiment, the piezoelectric ceramic is made of lead zirconate titanate PSI-5A4E (Lead zirconate titanate piezoelectric (PZT) ceramic, model PSI-5A4E from Piezo System Inc.). The first piezoelectric layer 60 has a first polarization direction 65 perpendicular to the first piezo-electric layer 60. The second piezoelectric layer 70 has a second polarization direction 75 perpendicular to the second piezoelectric layer 70. In current embodiment, the first polarization direction 65 is vertically downward; while the second polarization direction 75 is vertically upward (i.e., the first polarization direction 65 is opposite to the second polarization direction 75). Therefore, the piezoelectric material composite membrane acoustic component 1 with broadband and high sound quality of the present invention can indeed achieve an acoustic component with a smoother response curve, a larger frequency response, and can achieve balanced sound quality at low frequencies, intermediate frequencies and high frequencies.

In some embodiments, the first polarization direction 65 is vertically upward; while the second polarization direction 75 is vertically downward (i.e., the first polarization direction 65 is opposite to the second polarization direction 75). In some other embodiments, the first polarization direction 65 is vertically upward; and the second polarization direction 75 is vertically upward (i.e., the first polarization direction 65 is the same with the second polarization direction 75). In some other embodiments, the first polarization direction 65 is vertically downward; and the second polarization direction 75 is vertically downward (i.e., the first polarization direction 65 is the same with the second polarization direction 75).

In some embodiments, the vibrating membrane 2 may be a PVC membrane, or an electrically conductive membrane formed by sputtering a PVC membrane.

In some embodiments, the membrane fixing portion 20 of the vibrating membrane 2 is fixed between the top supporting frame 31 and the bottom supporting frame 32 by means of screwing. In some other embodiments, the membrane fixing portion 20 of the vibrating membrane 2 is fixed between the top supporting frame 31 and the bottom supporting frame 32 by an adhesive. In some embodiments, the top supporting frame 31 is engaged with the bottom supporting frame 32 so that the membrane fixing portion 20 of the vibrating membrane 2 is fixed between the top supporting frame 31 and the bottom supporting frame 32.

Figure 5:
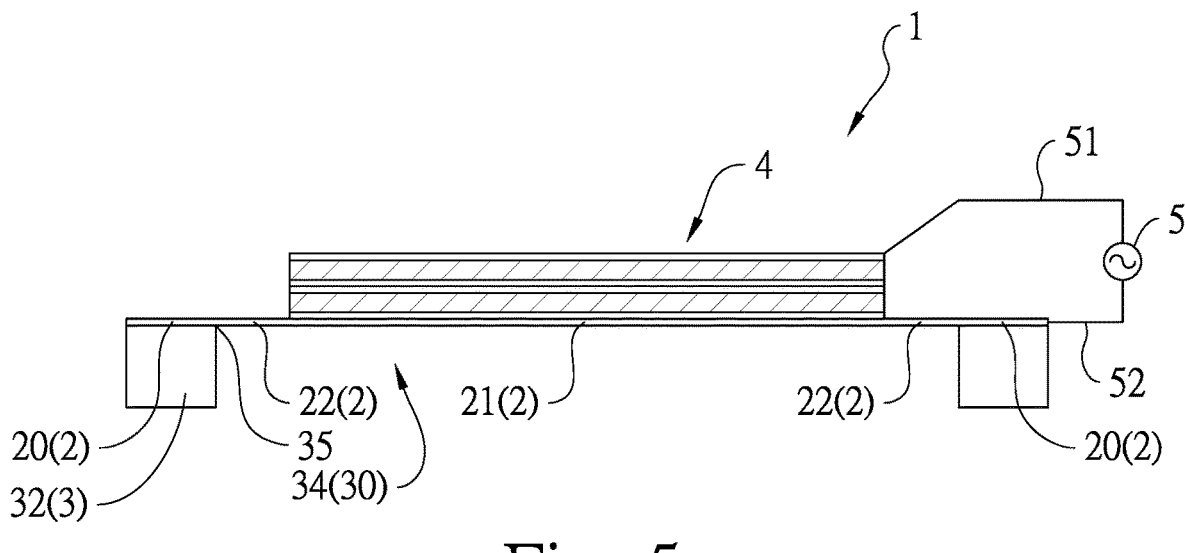
FIG. 5 is the cross-sectional schematic showing another embodiment of a piezoelectric material composite membrane acoustic component with broadband and high sound quality of the present invention.

Please refer to FIG. 5, which shows the cross-sectional schematic of another embodiment of a piezoelectric material composite membrane acoustic component with broadband and high sound quality of the present invention. The main structure of the embodiment of FIG. 5 is basically the same as the structure of the embodiment of FIG. 1, except that the supporting frame 3 includes the bottom supporting frame 32 (but does not include the top supporting frame 31), the hollow portion 30 includes the bottom hollow portion 34 (but does not include the top hollow portion 33), the membrane fixing portion 20 of the vibrating membrane 2 is fixed on the bottom supporting frame 32 of the supporting frame 3, such that the piezoelectric plate fixing portion 21 and the spacing portion 22 of the vibrating membrane 2 are corresponding to the hollow portion 30 of the supporting frame 3 (i.e., the piezoelectric plate fixing portion 21 and the spacing portion 22 of the vibrating membrane 2 are corresponding to the bottom hollow portion 34 of the bottom supporting frame 32).

In some embodiments, the membrane fixing portion 20 of the vibrating membrane 2 is fixed on the bottom supporting frame 32 by means of screwing. In some other embodiments, the membrane fixing portion 20 of the vibrating membrane 2 is fixed on the bottom supporting frame 32 by an adhesive.

In some embodiments (now shown in figure), the main structure is basically the same as the structure of the embodiment of FIG. 1, except that the supporting frame 3 includes the top supporting frame 31 (but does not include the bottom supporting frame 32), the hollow portion 30 includes the top hollow portion 33 (but does not include the bottom hollow portion 34), the membrane fixing portion 20 of the vibrating membrane 2 is fixed on the top supporting frame 31 of the supporting frame 3 by means of screwing, such that the piezoelectric plate fixing portion 21 and the spacing portion 22 of the vibrating membrane 2 are corresponding to the hollow portion 30 of the supporting frame 3 (i.e., the piezoelectric plate fixing portion 21 and the spacing portion 22 of the vibrating membrane 2 are corresponding to the top hollow portion 33 of the top supporting frame 31). In some other embodiments (now shown in figure), the main structure is basically the same as the structure of the embodiment of FIG. 1, except that the supporting frame 3 includes the top supporting frame 31 (but does not include the bottom supporting frame 32), the hollow portion 30 includes the top hollow portion 33 (but does not include the bottom hollow portion 34), the membrane fixing portion 20 of the vibrating membrane 2 is fixed on the top supporting frame 31 of the supporting frame 3 by an adhesive, such that the piezoelectric plate fixing portion 21 and the spacing portion 22 of the vibrating membrane 2 are corresponding to the hollow portion 30 of the supporting frame 3 (i.e., the piezoelectric plate fixing portion 21 and the spacing portion 22 of the vibrating membrane 2 are corresponding to the top hollow portion 33 of the top supporting frame 31).

Figure 6:
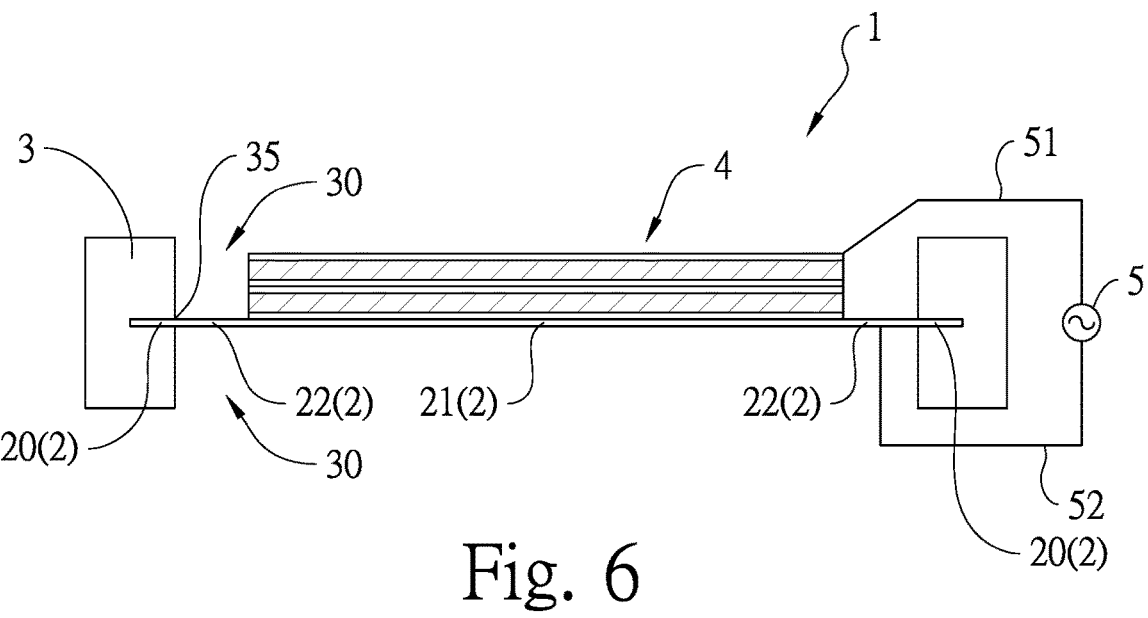
FIG. 6 is the cross-sectional schematic showing another embodiment of a piezoelectric material composite membrane acoustic component with broadband and high sound quality of the present invention.

Please refer to FIG. 6, which shows the cross-sectional schematic of another embodiment of a piezoelectric material composite membrane acoustic component with broadband and high sound quality of the present invention. The main structure of the embodiment of FIG. 6 is basically the same as the structure of the embodiment of FIG. 1, except that the supporting frame 3 is a single supporting frame (i.e., the supporting frame 3 is not composed of the top supporting frame 31 and the bottom supporting frame 32), the supporting frame 3 has the hollow portion 30, the supporting frame 3 is vertically penetrated by the hollow portion 30 (the hollow portion 30 is not composed of the top hollow portion 33 and the bottom hollow portion 34), the membrane fixing portion 20 of the vibrating membrane 2 is fixed in the supporting frame 3, such that the piezoelectric plate fixing portion 21 and the spacing portion 22 of the vibrating membrane 2 are corresponding to the hollow portion 30 of the supporting frame 3, wherein the membrane fixing portion 20 of the vibrating membrane 2 is fixed in the supporting frame 3 by means of screwing or by an adhesive.

Figure 7:
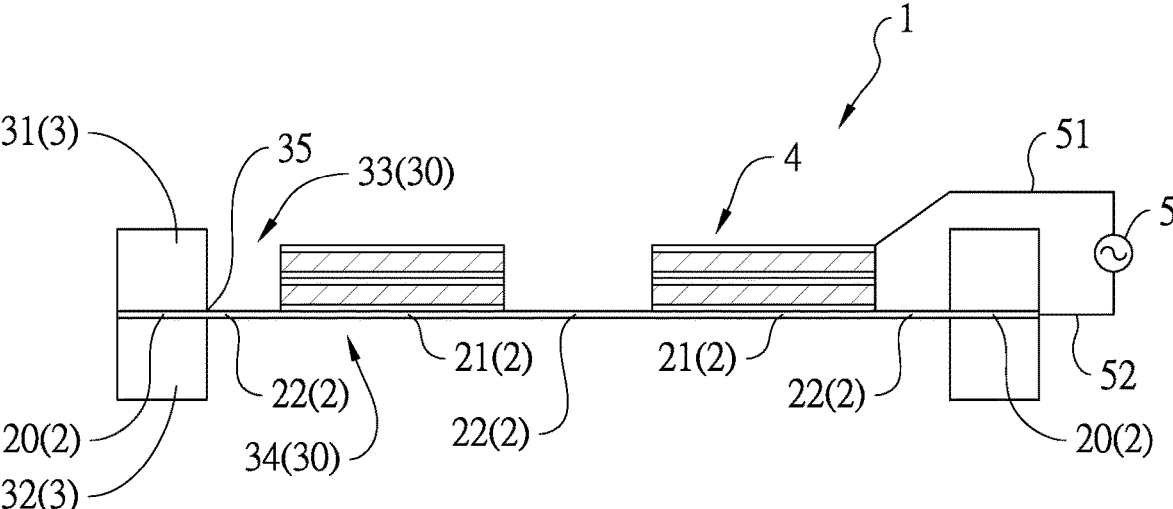
FIG. 7 is the cross-sectional schematic showing another embodiment of a piezoelectric material composite membrane acoustic component with broadband and high sound quality of the present invention.
Figure 8:
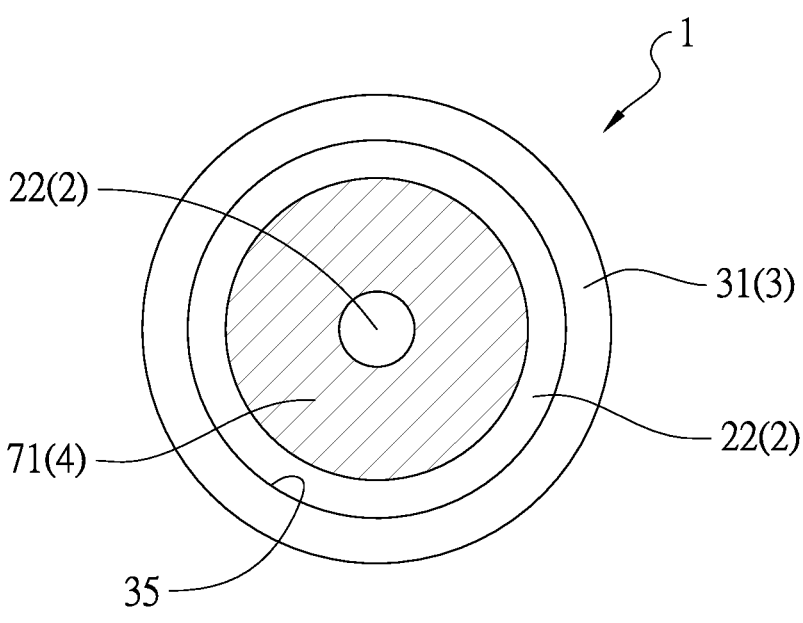
FIG. 8 is the top view schematic of the embodiment of FIG. 7.

Please refer to FIG. 7, which shows the cross-sectional schematic of another embodiment of a piezoelectric material composite membrane acoustic component with broadband and high sound quality of the present invention. Please also refer to FIG. 8, which shows the top view schematic of the embodiment of FIG. 7. The main structure of the embodiment of FIG. 7 is basically the same as the structure of the embodiment of FIG. 1, except that the vibrating membrane 2 includes a membrane fixing portion 20 (the shape of the fixing portion 20 is a ring), a piezoelectric plate fixing portion 21 (the shape of the piezoelectric plate fixing portion 21 is a ring; i.e., the shape of the piezoelectric plate set 4 is a ring) and two spacing portions 22 (the shape of one of the spacing portion 22 is a ring, while the shape of the other of the spacing portion 22 is a circle; the ring-shaped spacing portion 22 is between the membrane fixing portion 20 and the piezoelectric plate fixing portion 21, while the circle-shaped spacing portion 22 is within the piezoelectric plate fixing portion 21).

Figure 9:
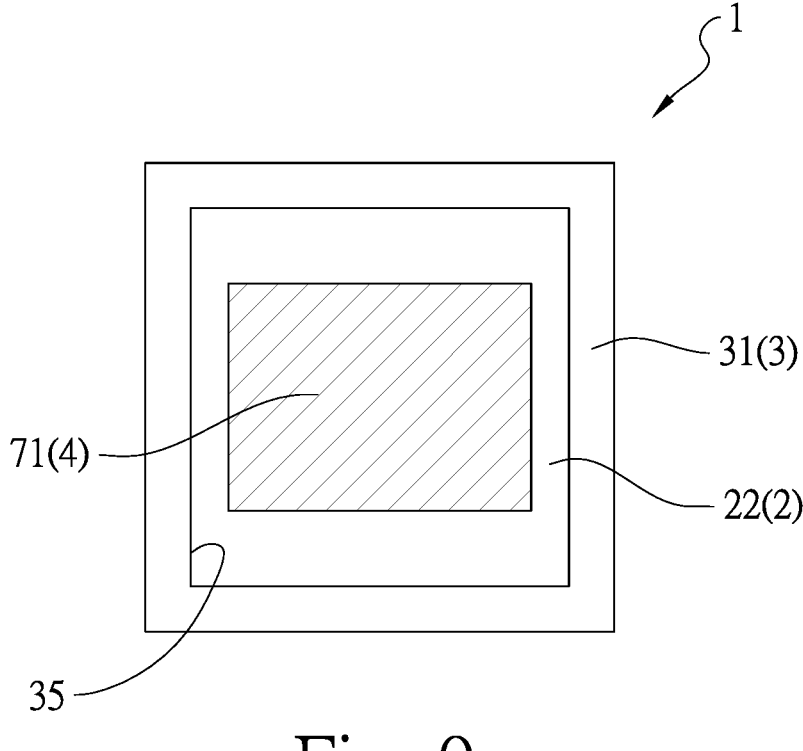
FIG. 9 is the cross-sectional schematic showing another embodiment of a piezoelectric material composite membrane acoustic component with broadband and high sound quality of the present invention.

Please refer to FIG. 9, which shows the cross-sectional schematic of another embodiment of a piezoelectric material composite membrane acoustic component with broadband and high sound quality of the present invention. The main structure of the embodiment of FIG. 9 is basically the same as the structure of the embodiment of FIG. 1, except that the vibrating membrane 2 includes a membrane fixing portion 20 (the shape of the fixing portion 20 is a hollow rectangle), a piezoelectric plate fixing portion 21 (the shape of the piezoelectric plate fixing portion 21 is a rectangle) and a spacing portion 22 (the shape of the spacing portion 22 is a hollow rectangle), the hollow rectangle shaped spacing portion 22 is between the hollow rectangle shaped membrane fixing portion 20 and the rectangle shaped piezoelectric plate fixing portion 21.

In some embodiments, the shape of the piezoelectric plate set 4 (including the first piezoelectric plate 6 and the second piezoelectric plate 7) is one selected from the group consisting of a quadrilateral, a polygon, an oval, a circle and a ring. In some embodiments, the shape of the inner edge 35 (i.e. the shape of the hollow portion 30) is one selected from the group consisting of a quadrilateral, a polygon, an oval and a circle. The shape of the piezoelectric plate set 4 (including the first piezoelectric plate 6 and the second piezoelectric plate 7) and the shape of the inner edge 35 (i.e. the shape of the hollow portion 30) can be matched with each other, and by optimizing the matching of geometric shapes, the size of the acoustic component with the best audio performance can be found, so that the piezoelectric material composite membrane acoustic component 1 with broadband and high sound quality can achieve a smoother response curve, a larger frequency response, and can achieve balanced sound quality at low frequencies, intermediate frequencies and high frequencies.

Figure 10:
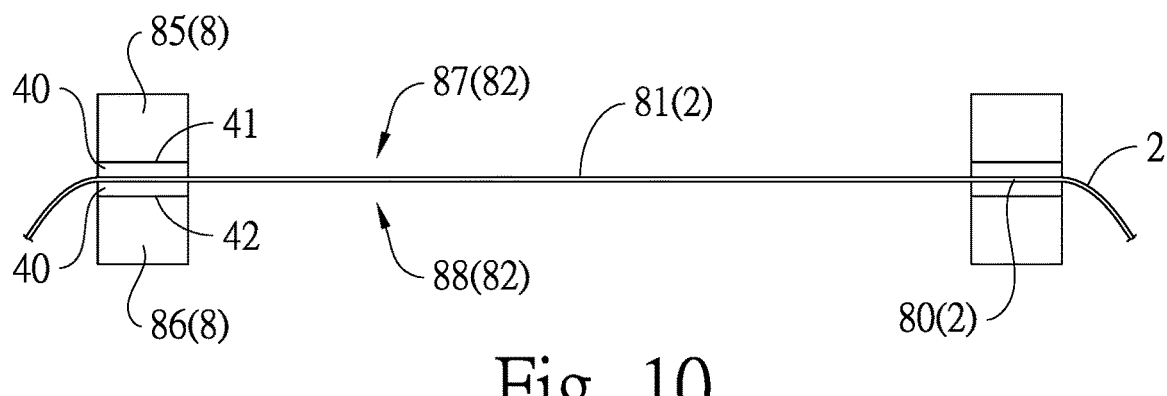
FIGS. 10-12 are the cross-sectional schematics showing steps of the manufacturing method of an embodiment of a piezoelectric material composite membrane acoustic component with broadband and high sound quality of the present invention.
Figure 11:
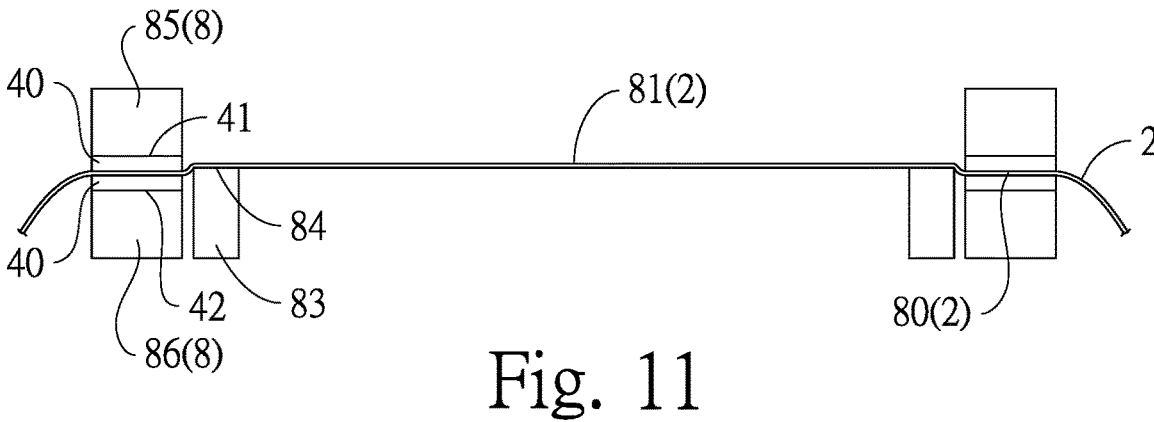
Figure 12:
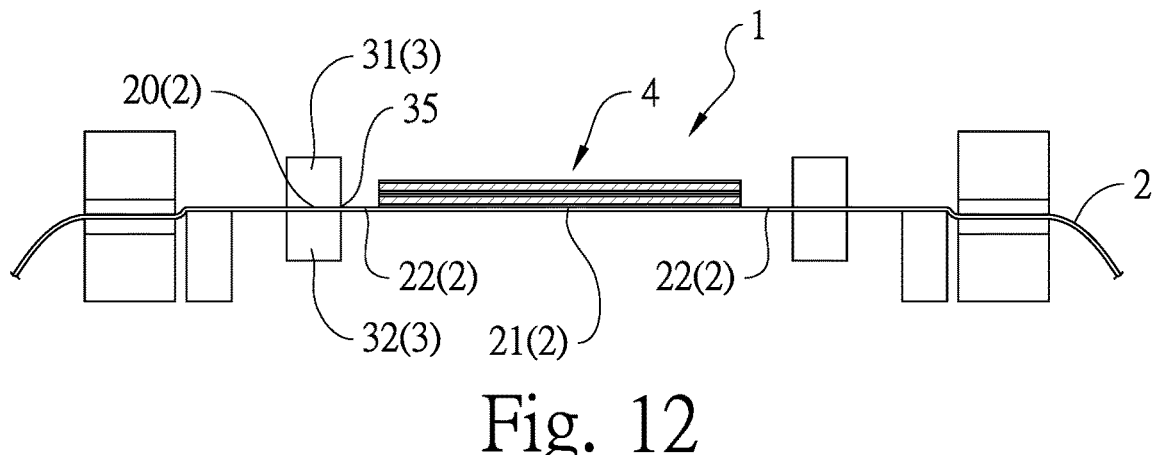

Please refer to FIGS. 10-12, which show the cross-sectional schematics of steps of the manufacturing method of an embodiment of a piezoelectric material composite membrane acoustic component with broadband and high sound quality of the present invention. A manufacturing method of a a piezoelectric material composite membrane acoustic component 1 with broadband and high sound quality of the present invention comprises following steps of: (please referring to FIG. 10) fixing a periphery region 80 of a vibrating membrane 2 by a fixing device 8 (in current embodiment, the fixing device 8 includes a top fixing device 85, a bottom fixing device 86 and two silicone layers 40, wherein the two silicone layers 40 are disposed on a bottom surface 41 of the top fixing device 85 and a top surface 42 of the bottom fixing device 86, respectively; the periphery region 80 of the vibrating membrane 2 is fixed between the two silicone layers 40 of the fixing device 8, wherein the silicone layer 40 can make the vibrating membrane 2 fixed and non-slip) such that a middle region 81 of the vibrating membrane 2 is corresponding to a device hollow portion 82 of the fixing device 8, wherein the fixing device 8 is vertically penetrated by the device hollow portion 82 (in current embodiment, the device hollow portion 82 includes a top device hollow portion 87 of the top fixing device 85 and a bottom device hollow portion 88 of the bottom fixing device 86, the top fixing device 85 is vertically penetrated by the top device hollow portion 87, the bottom fixing device 86 is vertically penetrated by the bottom device hollow portion 88; the middle region 81 of the vibrating membrane 2 is corresponding to the top device hollow portion 87 of the top fixing device 85 and the bottom device hollow portion 88 of the bottom fixing device 86, respectively), wherein the vibrating membrane 2 is an electrically conductive membrane, the middle region 81 of the vibrating membrane 2 includes a membrane fixing portion 20, a piezoelectric plate fixing portion 21 and a spacing portion 22 (in current embodiment, the shape of the fixing portion 20 is a ring, the shape of the piezoelectric plate fixing portion 21 is a circle, the shape of the spacing portion 22 is a ring), the spacing portion 22 is between the fixing portion 20 and the piezoelectric plate fixing portion 21; (please referring to FIG. 11) placing a tension-applying device 83 in the device hollow portion 82 of the fixing device 8 under the vibrating membrane 2 (the bottom device hollow portion 88), wherein a height of the tension-applying device 83 is greater than a height of the device hollow portion 82 of the fixing device 8 under the vibrating membrane 2 (the bottom device hollow portion 88), such that a top portion 84 of the tension-applying device 83 is against the vibrating membrane 2 so as to increase a tension of the vibrating membrane 2; (please referring to FIG. 12) fixing a first bottom electrode layer 62 of a first piezoelectric plate 6 of a piezoelectric plate set 4 on the piezoelectric plate fixing portion 21 of the middle region 81 of the vibrating membrane 2 by an electrically conductive adhesive such that the first bottom electrode layer 62 of the first piezoelectric plate 6 is electrically connected to the piezoelectric plate fixing portion 21 of the middle region 81 of the vibrating membrane 2, and fixing the membrane fixing portion 20 of the vibrating membrane 2 by a supporting frame 3 (in current embodiment, the supporting frame 3 includes a top supporting frame 31 and a bottom supporting frame 32, the membrane fixing portion 20 of the vibrating membrane 2 is sandwiched and fixed by the top supporting frame 31 and the bottom supporting frame 32 of the supporting frame 3) such that the piezoelectric plate fixing portion 21 and the spacing portion 22 between the membrane fixing portion 20 and the piezoelectric plate fixing portion 21 of the vibrating membrane 2 are corresponding to a hollow portion 30 of the supporting frame 3, wherein the supporting frame 3 is vertically penetrated by the hollow portion 30 (in current embodiment, the hollow portion 30 includes a top hollow portion 33 of the top supporting frame 31 and a bottom hollow portion 34 of the bottom supporting frame 32, the top supporting frame 31 is vertically penetrated by the top hollow portion 33, the bottom supporting frame 32 is vertically penetrated by the bottom hollow portion 34, the piezoelectric plate fixing portion 21 and the spacing portion 22 between the membrane fixing portion 20 and the piezoelectric plate fixing portion 21 of the vibrating membrane 2 are corresponding to the top hollow portion 33 of the top supporting frame 31 and the bottom hollow portion 34 of the bottom supporting frame 32, respectively), wherein the piezoelectric plate set 4 includes the first piezoelectric plate 6 and a second piezoelectric plate 7, the first piezoelectric plate 6 includes a first piezoelectric layer 60, a first top electrode layer 61 and a first bottom electrode layer 62, the first top electrode layer 61 and the first bottom electrode layer 62 are formed on a first top surface 63 and a first bottom surface 64 of the first piezoelectric layer 60 respectively, the second piezoelectric plate 7 includes a second piezoelectric layer 70, a second top electrode layer 71 and a second bottom electrode layer 72, the second top electrode layer 71 and the second bottom electrode layer 72 are formed on a second top surface 73 and a second bottom surface 74 of the second piezoelectric layer 70 respectively, the second bottom electrode layer 72 of the second piezoelectric plate 7 is fixed on the first top electrode layer 61 of the first piezoelectric plate 6 such that the second bottom electrode layer 72 of the second piezoelectric plate 7 is electrically connected to the first top electrode layer 61 of the first piezoelectric plate 6; (not shown in Figure) cutting the vibrating membrane 2 between the periphery region 80 and the membrane fixing portion 20 of the vibrating membrane 2; and (not shown in Figure) electrically connecting a first electrode 51 and a second electrode 52 of an AC power source 5 to the second top electrode layer 71 of the second piezoelectric plate 7 and the vibrating membrane 2 respectively, to form a piezoelectric material composite membrane acoustic component 1 with broadband and high sound quality as shown in FIG. 1. The manufacturing method of the piezoelectric material composite membrane acoustic component 1 with broadband and high sound quality of the present invention utilizes a fixed height difference between the height of the tension-applying device 83 and the height of the device hollow portion 82 of the fixing device 8 under the vibrating membrane 2 (the bottom device hollow portion 88), so as to increase the tension of the vibrating membrane 2 by a fixed amount (to fix the tension of the vibrating membrane 2) to maintain the stable quality of the piezoelectric material composite membrane acoustic component 1 with broadband and high sound quality.

The order of the step of cutting the vibrating membrane 2 between the periphery region 80 and the membrane fixing portion 20 of the vibrating membrane 2 and the step of electrically connecting a first electrode 51 and a second electrode 52 of an AC power source 5 to the second top electrode layer 71 of the second piezoelectric plate 7 and the vibrating membrane 2 respectively can be reversed.

In some embodiments, firstly, the first bottom electrode layer 62 of the first piezoelectric plate 6 of the piezoelectric plate set 4 is fixed on the piezoelectric plate fixing portion 21 of the middle region 81 of the vibrating membrane 2 by an electrically conductive adhesive; and then the membrane fixing portion 20 of the vibrating membrane 2 is fixed between the top supporting frame 31 and the bottom supporting frame 32 by means of screwing. In some other embodiments, firstly, the membrane fixing portion 20 of the vibrating membrane 2 is fixed between the top supporting frame 31 and the bottom supporting frame 32 by means of screwing; and then the first bottom electrode layer 62 of the first piezoelectric plate 6 of the piezoelectric plate set 4 is fixed on the piezoelectric plate fixing portion 21 of the middle region 81 of the vibrating membrane 2 by an electrically conductive adhesive. In some embodiments, firstly, the first bottom electrode layer 62 of the first piezoelectric plate 6 of the piezoelectric plate set 4 is fixed on the piezoelectric plate fixing portion 21 of the middle region 81 of the vibrating membrane 2 by an electrically conductive adhesive; and then the membrane fixing portion 20 of the vibrating membrane 2 is fixed between the top supporting frame 31 and the bottom supporting frame 32 by an adhesive. In some other embodiments, firstly, the membrane fixing portion 20 of the vibrating membrane 2 is fixed between the top supporting frame 31 and the bottom supporting frame 32 by an adhesive; and then the first bottom electrode layer 62 of the first piezoelectric plate 6 of the piezoelectric plate set 4 is fixed on the piezoelectric plate fixing portion 21 of the middle region 81 of the vibrating membrane 2 by an electrically conductive adhesive. In some embodiments, firstly, the first bottom electrode layer 62 of the first piezoelectric plate 6 of the piezoelectric plate set 4 is fixed on the piezoelectric plate fixing portion 21 of the middle region 81 of the vibrating membrane 2 by an electrically conductive adhesive; and then the top supporting frame 31 is engaged with the bottom supporting frame 32 so that the membrane fixing portion 20 of the vibrating membrane 2 is fixed between the top supporting frame 31 and the bottom supporting frame 32. In some other embodiments, firstly, the top supporting frame 31 is engaged with the bottom supporting frame 32 so that the membrane fixing portion 20 of the vibrating membrane 2 is fixed between the top supporting frame 31 and the bottom supporting frame 32; and then the first bottom electrode layer 62 of the first piezoelectric plate 6 of the piezoelectric plate set 4 is fixed on the piezoelectric plate fixing portion 21 of the middle region 81 of the vibrating membrane 2 by an electrically conductive adhesive.

Figure 13:
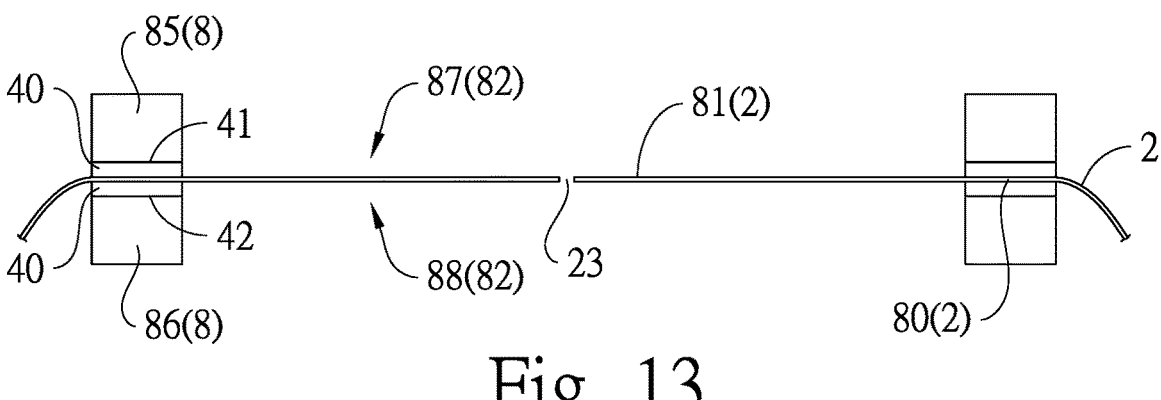
FIGS. 13-15 are the cross-sectional schematics showing steps of the manufacturing method of another embodiment of a piezoelectric material composite membrane acoustic component with broadband and high sound quality of the present invention.
Figure 14:
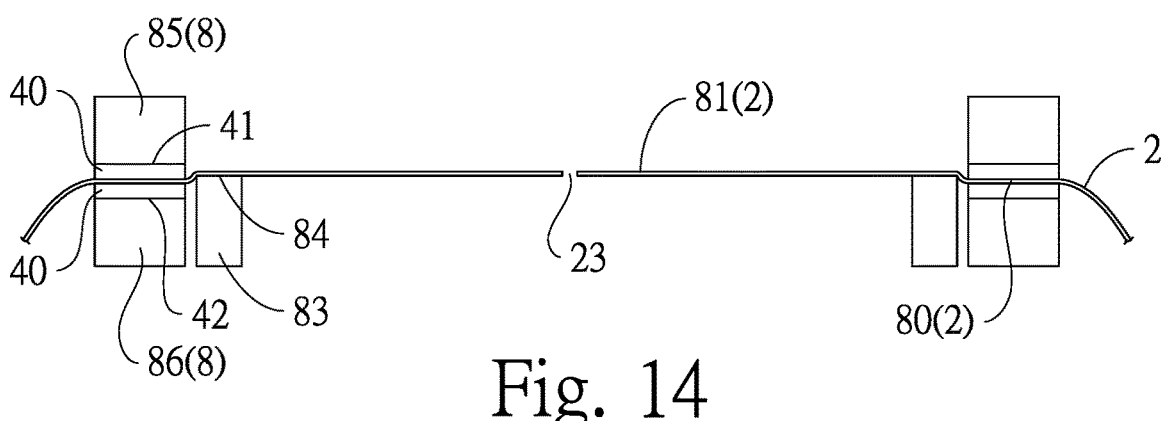
Figure 15:
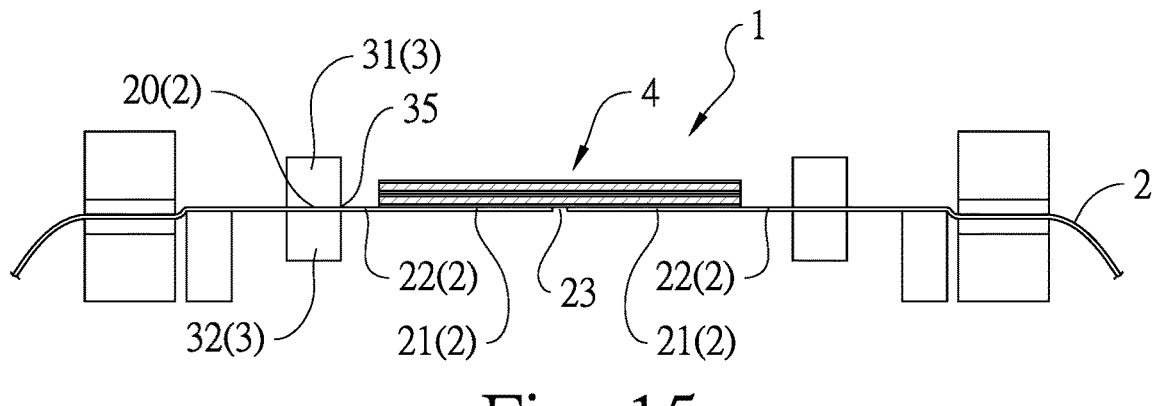

Please refer to FIGS. 13-15, which show the cross-sectional schematics of steps of the manufacturing method of another embodiment of a piezoelectric material composite membrane acoustic component with broadband and high sound quality of the present invention. A manufacturing method of a a piezoelectric material composite membrane acoustic component 1 with broadband and high sound quality of the present invention comprises following steps of: (please referring to FIG. 13) fixing a periphery region 80 of a vibrating membrane 2 by a fixing device 8 (in current embodiment, the fixing device 8 includes a top fixing device 85, a bottom fixing device 86 and two silicone layers 40, wherein the two silicone layers 40 are disposed on a bottom surface 41 of the top fixing device 85 and a top surface 42 of the bottom fixing device 86, respectively; the periphery region 80 of the vibrating membrane 2 is fixed between the two silicone layers 40 of the fixing device 8, wherein the silicone layer 40 can make the vibrating membrane 2 fixed and non-slip) such that a middle region 81 of the vibrating membrane 2 is corresponding to a device hollow portion 82 of the fixing device 8, wherein the fixing device 8 is vertically penetrated by the device hollow portion 82 (in current embodiment, the device hollow portion 82 includes a top device hollow portion 87 of the top fixing device 85 and a bottom device hollow portion 88 of the bottom fixing device 86, the top fixing device 85 is vertically penetrated by the top device hollow portion 87, the bottom fixing device 86 is vertically penetrated by the bottom device hollow portion 88; the middle region 81 of the vibrating membrane 2 is corresponding to the top device hollow portion 87 of the top fixing device 85 and the bottom device hollow portion 88 of the bottom fixing device 86, respectively), wherein middle region 81 of the vibrating membrane 2 includes a membrane fixing portion 20, a piezoelectric plate fixing portion 21 and a spacing portion 22 (in current embodiment, the shape of the fixing portion 20 is a ring, the shape of the piezoelectric plate fixing portion 21 is a circle, the shape of the spacing portion 22 is a ring), the spacing portion 22 is between the fixing portion 20 and the piezoelectric plate fixing portion 21, the piezoelectric plate fixing portion 21 of the vibrating membrane 2 has a through hole 23, the piezoelectric plate fixing portion 21 of the vibrating membrane 2 is penetrated by the through hole 23; (please referring to FIG. 14) placing a tension-applying device 83 in the device hollow portion 82 of the fixing device 8 under the vibrating membrane 2 (the bottom device hollow portion 88), wherein a height of the tension-applying device 83 is greater than a height of the device hollow portion 82 of the fixing device 8 under the vibrating membrane 2 (the bottom device hollow portion 88), such that a top portion 84 of the tension-applying device 83 is against the vibrating membrane 2 so as to increase a tension of the vibrating membrane 2; (please referring to FIG. 15) fixing a first bottom electrode layer 62 of a first piezoelectric plate 6 of a piezoelectric plate set 4 on the piezoelectric plate fixing portion 21 of the middle region 81 of the vibrating membrane 2, and fixing the membrane fixing portion 20 of the vibrating membrane 2 by a supporting frame 3 (in current embodiment, the supporting frame 3 includes a top supporting frame 31 and a bottom supporting frame 32, the membrane fixing portion 20 of the vibrating membrane 2 is sandwiched and fixed by the top supporting frame 31 and the bottom supporting frame 32 of the supporting frame 3) such that the piezoelectric plate fixing portion 21 and the spacing portion 22 between the membrane fixing portion 20 and the piezoelectric plate fixing portion 21 of the vibrating membrane 2 are corresponding to a hollow portion 30 of the supporting frame 3, wherein the supporting frame 3 is vertically penetrated by the hollow portion 30 (in current embodiment, the hollow portion 30 includes a top hollow portion 33 of the top supporting frame 31 and a bottom hollow portion 34 of the bottom supporting frame 32, the top supporting frame 31 is vertically penetrated by the top hollow portion 33, the bottom supporting frame 32 is vertically penetrated by the bottom hollow portion 34, the piezoelectric plate fixing portion 21 and the spacing portion 22 between the membrane fixing portion 20 and the piezoelectric plate fixing portion 21 of the vibrating membrane 2 are corresponding to the top hollow portion 33 of the top supporting frame 31 and the bottom hollow portion 34 of the bottom supporting frame 32, respectively), wherein the piezoelectric plate set 4 includes the first piezoelectric plate 6 and a second piezoelectric plate 7, the first piezoelectric plate 6 includes a first piezoelectric layer 60, a first top electrode layer 61 and a first bottom electrode layer 62, the first top electrode layer 61 and the first bottom electrode layer 62 are formed on a first top surface 63 and a first bottom surface 64 of the first piezoelectric layer 60 respectively, the second piezoelectric plate 7 includes a second piezoelectric layer 70, a second top electrode layer 71 and a second bottom electrode layer 72, the second top electrode layer 71 and the second bottom electrode layer 72 are formed on a second top surface 73 and a second bottom surface 74 of the second piezoelectric layer 70 respectively, the second bottom electrode layer 72 of the second piezoelectric plate 7 is fixed on the first top electrode layer 61 of the first piezoelectric plate 6 such that the second bottom electrode layer 72 of the second piezoelectric plate 7 is electrically connected to the first top electrode layer 61 of the first piezoelectric plate 6; (not shown in Figure) cutting the vibrating membrane 2 between the periphery region 80 and the membrane fixing portion 20 of the vibrating membrane 2; and (not shown in Figure) electrically connecting a first electrode 51 of an AC power source 5 to the second top electrode layer 71 of the second piezoelectric plate 7 and electrically connecting a second electrode 52 of the AC power source 5 to the first bottom electrode layer 62 of the first piezoelectric plate 6 through the through hole 23, to form a piezoelectric material composite membrane acoustic component 1 with broadband and high sound quality as shown in FIG. 4. The manufacturing method of the piezoelectric material composite membrane acoustic component 1 with broadband and high sound quality of the present invention utilizes a fixed height difference between the height of the tension-applying device 83 and the height of the device hollow portion 82 of the fixing device 8 under the vibrating membrane 2 (the bottom device hollow portion 88), so as to increase the tension of the vibrating membrane 2 by a fixed amount (to fix the tension of the vibrating membrane 2) to maintain the stable quality of the piezoelectric material composite membrane acoustic component 1 with broadband and high sound quality.

The order of the step of cutting the vibrating membrane 2 between the periphery region 80 and the membrane fixing portion 20 of the vibrating membrane 2 and the step of electrically connecting a first electrode 51 of an AC power source 5 to the second top electrode layer 71 of the second piezoelectric plate 7 and electrically connecting a second electrode 52 of the AC power source 5 to the first bottom electrode layer 62 of the first piezoelectric plate 6 through the through hole 23 can be reversed.

In some embodiments, firstly, the first bottom electrode layer 62 of the first piezoelectric plate 6 of the piezoelectric plate set 4 is fixed on the piezoelectric plate fixing portion 21 of the middle region 81 of the vibrating membrane 2 by a non-electrically conductive adhesive or an electrically conductive adhesive; and then the membrane fixing portion 20 of the vibrating membrane 2 is fixed between the top supporting frame 31 and the bottom supporting frame 32 by means of screwing. In some other embodiments, firstly, the membrane fixing portion 20 of the vibrating membrane 2 is fixed between the top supporting frame 31 and the bottom supporting frame 32 by means of screwing; and then the first bottom electrode layer 62 of the first piezoelectric plate 6 of the piezoelectric plate set 4 is fixed on the piezoelectric plate fixing portion 21 of the middle region 81 of the vibrating membrane 2 by a non-electrically conductive adhesive or an electrically conductive adhesive. In some embodiments, firstly, the first bottom electrode layer 62 of the first piezoelectric plate 6 of the piezoelectric plate set 4 is fixed on the piezoelectric plate fixing portion 21 of the middle region 81 of the vibrating membrane 2 by a non-electrically conductive adhesive or an electrically conductive adhesive; and then the membrane fixing portion 20 of the vibrating membrane 2 is fixed between the top supporting frame 31 and the bottom supporting frame 32 by an adhesive. In some other embodiments, firstly, the membrane fixing portion 20 of the vibrating membrane 2 is fixed between the top supporting frame 31 and the bottom supporting frame 32 by an adhesive; and then the first bottom electrode layer 62 of the first piezoelectric plate 6 of the piezoelectric plate set 4 is fixed on the piezoelectric plate fixing portion 21 of the middle region 81 of the vibrating membrane 2 by a non-electrically conductive adhesive or an electrically conductive adhesive. In some embodiments, firstly, the first bottom electrode layer 62 of the first piezoelectric plate 6 of the piezoelectric plate set 4 is fixed on the piezoelectric plate fixing portion 21 of the middle region 81 of the vibrating membrane 2 by a non-electrically conductive adhesive or an electrically conductive adhesive; and then the top supporting frame 31 is engaged with the bottom supporting frame 32 so that the membrane fixing portion 20 of the vibrating membrane 2 is fixed between the top supporting frame 31 and the bottom supporting frame 32. In some other embodiments, firstly, the top supporting frame 31 is engaged with the bottom supporting frame 32 so that the membrane fixing portion 20 of the vibrating membrane 2 is fixed between the top supporting frame 31 and the bottom supporting frame 32; and then the first bottom electrode layer 62 of the first piezoelectric plate 6 of the piezoelectric plate set 4 is fixed on the piezoelectric plate fixing portion 21 of the middle region 81 of the vibrating membrane 2 by a non-electrically conductive adhesive or an electrically conductive adhesive.

In some embodiments, firstly, the first bottom electrode layer 62 of the first piezoelectric plate 6 of the piezoelectric plate set 4 is fixed on the piezoelectric plate fixing portion 21 of the middle region 81 of the vibrating membrane 2 by means of gluing, and the membrane fixing portion 20 of the vibrating membrane 2 is fixed on the top supporting frame 31 by means of screwing or gluing; and then the vibrating membrane 2 between the periphery region 80 and the membrane fixing portion 20 of the vibrating membrane 2 is cut; and then the bottom supporting frame 32 is fixed to the membrane fixing portion 20 of the vibrating membrane 2 and/or the top supporting frame 31 by means of screwing, gluing or engagement. In some other embodiments, firstly, the first bottom electrode layer 62 of the first piezoelectric plate 6 of the piezoelectric plate set 4 is fixed on the piezoelectric plate fixing portion 21 of the middle region 81 of the vibrating membrane 2 by means of gluing, and the membrane fixing portion 20 of the vibrating membrane 2 is fixed on bottom supporting frame 32 by means of screwing or gluing; and then the vibrating membrane 2 between the periphery region 80 and the membrane fixing portion 20 of the vibrating membrane 2 is cut; and then the top supporting frame 31 is fixed to the membrane fixing portion 20 of the vibrating membrane 2 and/or the bottom supporting frame 32 by means of screwing, gluing or engagement.

In some embodiments, in the manufacturing method of piezoelectric material composite membrane acoustic component with broadband and high sound quality of the present invention, when fixing the first bottom electrode layer 62 of the first piezoelectric plate 6 of the piezoelectric plate set 4 on the piezoelectric plate fixing portion 21 of the middle region 81 of the vibrating membrane 2, the manufacturing method may further comprises a step of applying an external force on the piezoelectric plate set 4 such that the first bottom electrode layer 62 of the first piezoelectric plate 6 of the piezoelectric plate set 4 is tightly fixed with the piezoelectric plate fixing portion 21 of the middle region 81 of the vibrating membrane 2.

In some embodiments, the periphery region 80 of the vibrating membrane 2 is fixed between the silicone layer 40 disposed on the bottom surface 41 of the top fixing device 85 and the silicone layer 40 disposed on the top surface 42 of the bottom fixing device 86 by means of screwing, gluing or engagement.

In some embodiments, the fixing device 8 includes the bottom fixing device 86 and the silicone layer 40 disposed on the top surface 42 of the bottom fixing device 86 (but does not include the top fixing device 85 and the silicone layer 40 disposed on the bottom surface 41 of the top fixing device 85), wherein the periphery region 80 of the vibrating membrane 2 is fixed on the silicone layer 40 disposed on the top surface 42 of the bottom fixing device 86 by means of screwing or gluing. In some other embodiments, the fixing device 8 includes the bottom fixing device 86 (but does not include the top fixing device 85, the silicone layer 40 disposed on the bottom surface 41 of the top fixing device 85 and the silicone layer 40 disposed on the top surface 42 of the bottom fixing device 86), wherein the periphery region 80 of the vibrating membrane 2 is fixed on the bottom fixing device 86 by means of screwing or gluing. In some other embodiments, the fixing device 8 includes the top fixing device 85, the bottom fixing device 86 and the silicone layer 40 disposed on the top surface 42 of the bottom fixing device 86 (but does not include the silicone layer 40 disposed on the bottom surface 41 of the top fixing device 85), wherein the periphery region 80 of the vibrating membrane 2 is fixed between the top fixing device 85 and the silicone layer 40 disposed on the top surface 42 of the bottom fixing device 86 by means of screwing, gluing or engagement. In some other embodiments, the fixing device 8 includes the top fixing device 85, the silicone layer 40 disposed on the bottom surface 41 of the top fixing device 85 and the bottom fixing device 86 (but does not include the silicone layer 40 disposed on the top surface 42 of the bottom fixing device 86), wherein the periphery region 80 of the vibrating membrane 2 is fixed between the silicone layer 40 disposed on the bottom surface 41 of the top fixing device 85 and the bottom fixing device 86 by means of screwing, gluing or engagement. In some other embodiments, the fixing device 8 includes the top fixing device 85 and the bottom fixing device 86 (but does not include the silicone layer 40 disposed on the bottom surface 41 of the top fixing device 85 and the silicone layer 40 disposed on the top surface 42 of the bottom fixing device 86), wherein the periphery region 80 of the vibrating membrane 2 is fixed between the top fixing device 85 and the bottom fixing device 86 by means of screwing, gluing or engagement.

As disclosed in the above description and attached drawings, the present invention can provide a piezoelectric material composite membrane acoustic component with broadband and high sound quality and a manufacturing method thereof. It is new and can be put into industrial use.

Although the embodiments of the present invention have been described in detail, many modifications and variations may be made by those skilled in the art from the teachings disclosed hereinabove. Therefore, it should be understood that any modification and variation equivalent to the spirit of the present invention be regarded to fall into the scope defined by the appended claims.

What is claimed is:

1. A piezoelectric material composite membrane acoustic component with broadband and high sound quality, comprising:

a vibrating membrane including a membrane fixing portion, a piezoelectric plate fixing portion and at least one spacing portion, at least one of said at least one spacing portion is between said membrane fixing portion and said piezoelectric plate fixing portion, wherein said piezoelectric plate fixing portion is surrounded by said at least one of said at least one spacing portion, and said at least one of said at least one spacing portion is surrounded by said membrane fixing portion;

a supporting frame having a hollow portion, said supporting frame is vertically penetrated by said hollow portion, said membrane fixing portion of said vibrating membrane is fixed by said supporting frame such that said piezoelectric plate fixing portion and said at least one spacing portion of said vibrating membrane are corresponding to said hollow portion of said supporting frame;

a piezoelectric plate set, which includes:

a first piezoelectric plate, which includes:

a first piezoelectric layer;

a first top electrode layer formed on a first top surface of said first piezoelectric layer; and a first bottom electrode layer formed on a first bottom surface of said first piezoelectric layer, said first bottom electrode layer of said first piezoelectric plate is fixed on said piezoelectric plate fixing portion of said vibrating membrane; and a second piezoelectric plate, which includes:

a second piezoelectric layer;

a second top electrode layer formed on a second top surface of said second piezoelectric layer; and a second bottom electrode layer formed on a second bottom surface of said second piezoelectric layer, said second bottom electrode layer of said second piezoelectric plate is fixed on said first top electrode layer of said first piezoelectric plate such that said second bottom electrode layer of said second piezoelectric plate is electrically connected to said first top electrode layer of said first piezoelectric plate; and an AC power source, which includes:

a first electrode and a second electrode, wherein said first electrode of said AC power source is electrically connected to said second top electrode layer of said second piezoelectric plate;

wherein said first bottom electrode layer of said first piezoelectric plate, said first piezoelectric layer of said first piezoelectric plate, said first top electrode layer of said first piezoelectric plate, said second bottom electrode layer of said second piezoelectric plate, said second piezoelectric layer of said second piezoelectric plate and said second top electrode layer of said second piezoelectric plate are disposed on a top surface of said piezoelectric plate fixing portion of said vibrating membrane in an order from bottom to top, wherein said piezoelectric plate fixing portion of said vibrating membrane has a through hole, said piezoelectric plate fixing portion of said vibrating membrane is penetrated by said through hole, said second electrode of said AC power source is electrically connected to said first bottom electrode layer of said first piezoelectric plate through said through hole, wherein said first top electrode layer of said first piezoelectric plate and said second bottom electrode layer of said second piezoelectric plate are not electrically connected to said first electrode of said AC power source, and said first top electrode layer of said first piezoelectric plate and said second bottom electrode layer of said second piezoelectric plate are not electrically connected to said second electrode of said AC power source.

2. The piezoelectric material composite membrane acoustic component with broadband and high sound quality according to claim 1, wherein said first bottom electrode layer of said first piezoelectric plate is electrically connected to said piezoelectric plate fixing portion of said vibrating membrane through an electrically conductive adhesive.

3. The piezoelectric material composite membrane acoustic component with broadband and high sound quality according to claim 1, wherein said first piezoelectric layer has a first polarization direction perpendicular to said first piezoelectric layer, said second piezoelectric layer has a second polarization direction perpendicular to said second piezoelectric layer, said first polarization direction is the same with said second polarization direction.

4. The piezoelectric material composite membrane acoustic component with broadband and high sound quality according to claim 1, wherein said first piezoelectric layer has a first polarization direction perpendicular to said first piezoelectric layer, said second piezoelectric layer has a second polarization direction perpendicular to said second piezoelectric layer, said first polarization direction is opposite to said second polarization direction.

5. The piezoelectric material composite membrane acoustic component with broadband and high sound quality according to claim 1, wherein said first piezoelectric layer and said second piezoelectric layer are made of a piezoelectric ceramic, respectively.

6. The piezoelectric material composite membrane acoustic component with broadband and high sound quality according to claim 5, wherein said piezoelectric ceramic is at least one selected from the group consisting of lead zirconate titanate PZT-5A, lead zirconate titanate PZT-5H and lead zirconate titanate PZT-5J.

7. The piezoelectric material composite membrane acoustic component with broadband and high sound quality according to claim 6, wherein said piezoelectric ceramic is made of lead zirconate titanate PSI-5A4E.

8. The piezoelectric material composite membrane acoustic component with broadband and high sound quality according to claim 1, wherein said supporting frame includes a top supporting frame and a bottom supporting frame, said top supporting frame has a top hollow portion, said top supporting frame is vertically penetrated by said top hollow portion, said bottom supporting frame has a bottom hollow portion, said bottom supporting frame is vertically penetrated by said bottom hollow portion, said membrane fixing portion of said vibrating membrane is sandwiched and fixed by said top supporting frame and said bottom supporting frame respectively, such that said piezoelectric plate fixing portion and said at least one spacing portion of said vibrating membrane are corresponding to said top hollow portion of said top supporting frame and said bottom hollow portion of said bottom supporting frame, respectively.

9. The piezoelectric material composite membrane acoustic component with broadband and high sound quality according to claim 1, wherein a shape of said first piezoelectric plate is one selected from the group consisting of a polygon, an oval, a circle and a ring.

10. The piezoelectric material composite membrane acoustic component with broadband and high sound quality according to claim 1, wherein said hollow portion of said supporting frame is defined by an inner edge of said supporting frame, a shape of said inner edge of said supporting frame is one selected from the group consisting of a polygon, an oval and a circle.

11. The piezoelectric material composite membrane acoustic component with broadband and high sound quality according to claim 1, wherein said first piezoelectric plate and said second piezoelectric plate have the same shape.

12. The piezoelectric material composite membrane acoustic component with broadband and high sound quality according to claim 1, wherein said first piezoelectric plate and said second piezoelectric plate have the same thickness.

* * * * *